United States Patent
Kim et al.

(10) Patent No.: US 9,356,563 B2
(45) Date of Patent: May 31, 2016

(54) ANALOG BASEBAND FILTER FOR RADIO TRANSCEIVER

(71) Applicant: Samsung Electronics Co., Ltd., Suwon-si, Gyeonggi-do (KR)

(72) Inventors: Jae-Kwon Kim, Jeongseon-gun (KR); Jong-Woo Lee, Seoul (KR); Jae-Hyun Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/735,454

(22) Filed: Jun. 10, 2015

(65) Prior Publication Data

US 2015/0280656 A1    Oct. 1, 2015

Related U.S. Application Data

(63) Continuation of application No. 13/937,780, filed on Jul. 9, 2013.

(30) Foreign Application Priority Data

Feb. 22, 2013 (KR) .................. 10-2013-0018944

(51) Int. Cl.
| H03F 3/193 | (2006.01) |
|---|---|
| H03F 1/30 | (2006.01) |
| H03F 3/45 | (2006.01) |
| H03G 1/00 | (2006.01) |
| H03G 3/00 | (2006.01) |
| H04B 1/401 | (2015.01) |
| H04B 1/00 | (2006.01) |

(52) U.S. Cl.
CPC ............. *H03F 1/30* (2013.01); *H03F 3/45179* (2013.01); *H03G 1/0088* (2013.01); *H03G 3/001* (2013.01); *H04B 1/401* (2013.01); *H03F 2200/447* (2013.01); *H03F 2203/45591* (2013.01); *H03F 2203/45604* (2013.01); *H04B 1/005* (2013.01)

(58) Field of Classification Search
CPC ...................................................... H03F 3/193
USPC ................. 455/90.2, 113, 118, 306, 307, 313
See application file for complete search history.

(56) References Cited

U.S. PATENT DOCUMENTS

| 7,616,062 | B2 | 11/2009 | Miyamoto et al. | |
|---|---|---|---|---|
| 8,415,940 | B2 * | 4/2013 | Yin et al. | ....................... 323/314 |
| 2003/0076139 | A1 | 4/2003 | Miyagawa et al. | |
| 2011/0080154 | A1 | 4/2011 | Yin et al. | |
| 2011/0230156 | A1 | 9/2011 | Mehrmanesh et al. | |
| 2011/0304461 | A1 * | 12/2011 | Song et al. | .................. 340/572.1 |
| 2012/0019405 | A1 | 1/2012 | Nadimpalli et al. | |
| 2012/0212284 | A1 | 8/2012 | Horie et al. | |
| 2012/0243262 | A1 | 9/2012 | Ger et al. | |
| 2012/0262244 | A1 | 10/2012 | Terasawa | |

* cited by examiner

*Primary Examiner* — Tuan H Nguyen
(74) *Attorney, Agent, or Firm* — Jefferson IP Law, LLP

(57) ABSTRACT

An analog baseband filter for a radio transceiver is provided. An analog baseband filter for a multi-mode multi-band radio transceiver includes a current-voltage conversion amplifier converting a current received at the analog baseband filter into a voltage and adjusting a gain of an output voltage of the current-voltage conversion amplifier using a plurality of resistors, and a source follower circuit compensating for temperature for the output voltage of the current-voltage conversion amplifier.

17 Claims, 8 Drawing Sheets

ANALOG BASEBAND FILTER FOR RADIO TRANSCEIVER

CROSS-REFERENCE TO RELATED APPLICATION(S)

This application is a continuation application of a prior application Ser. No. 13/937,780, filed on Jul. 9, 2013, which claimed the benefit under 35 U.S.C. §119(a) of a Korean patent application filed on Feb. 22, 2013 in the Korean Intellectual Property Office and assigned Serial number 10-2013-0018944, the entire disclosure of which is hereby incorporated by reference.

BACKGROUND OF THE INVENTION

1. Field of the Invention

The present invention relates generally to a radio transceiver. More particularly, the present invention relates to an analog baseband filter constituting a Radio Frequency Integrated Circuit (RFIC) of a multi-mode multi-band radio transceiver.

2. Description of the Related Art

A Radio Frequency Integrated Circuit (RFIC) may be an integrated circuit that operates in a range of radio frequencies ranging from about 300 MHz to about 30 GHz, and the RFIC is used in mobile phones, notebook computers, smart phones, Bluetooth products, and the like. Lately, RFICs should be manufactured in a small size and to operate with low power in order to increase a battery life of mobile terminals while supporting various communication protocols used in Second-Generation (2G), Third-Generation (3G), Fourth-Generation (4G) communication networks, and the like on a single chip. In order for the RFIC to have a small size, functions of blocks included in an RFIC should be integrated in order to reduce the number of blocks and to minimize current consumed by each block. However, in communication systems in which 16-Quadrature Amplitude Modulation (QAM) (16QAM) or 64QAM is used in order to process a large amount of data, like in a Long Term Evolution (LTE) communication network, it is difficult to reduce current consumption and the circuit area while ensuring performance required by the 16QAM or 64QAM.

FIG. 1 illustrates a structure of a transmission (TX) chain of a RFIC according to the related art.

Referring to FIG. 1, the TX chain of the RFIC includes a baseband modem 110, an analog baseband 120, and a Radio Frequency (RF) front-end 130. The analog baseband 120 includes a Current-to-Voltage (I-V) converter 121, a Power Gain Amplifier (PGA) 122, a Ramping Variable Gain Amplifier (RVGA) 123, and a Low Pass Filter (LPF) 124.

The I-V converter 121 converts a current received from the baseband modem 110 operating in a current mode into a voltage, and the PGA 122 attenuates the received signal by a predetermined gain. The PGA 122 and the RVGA 123 have a gain/dynamic range of −30 dB to 0 dB and of −50 dB to 0 dB, respectively, according to received codes. Then, the LPF 124 removes images and noise from the input signal and transfers the resultant signal to the RF front-end 130. There have been various efforts and proposals for reducing the current consumption and size of an RFIC, and one of the proposals is an integrated circuit of an I-V converter and a PGA.

FIG. 2 illustrates a structure in which an I-V converter is integrated with a PGA according to the related art.

Referring to FIG. 2, functions of the PGA are implemented by connecting switches and resistors to the I-V converter in a multi-stage fashion. However, due to a property of the resistor wherein resistance depends on a temperature, the structure illustrated in FIG. 2 may have a problem that a common mode voltage varies and Local Oscillator (LO) leakage occurs when a temperature changes after Direct Current (DC) offset calibration.

FIG. 3 illustrates a PGA structure according to the related art.

Referring to FIG. 3, a structure which ensures a gain/dynamic range with a PGA that uses an active device is illustrated, and a gain value is determined according to a resistance ratio of resistance R1 to resistance R2. However, since the PGA structure of FIG. 3 includes an Operational-Amplifier (OP-AMP) which is an active device, the PGA structure may consume a large amount of current and occupy a wide area.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide an apparatus for integrating components of an analog baseband into a single unit in a transmission (TX) chain of a Radio Frequency Integrated Circuit (RFIC), thereby reducing current consumption and a physical size of the RFIC.

In accordance with an aspect of the present invention, an analog baseband filter for a multi-mode multi-band radio transceiver is provided. The analog baseband filter includes a current-voltage conversion amplifier converting a current received at the analog baseband filter into a voltage and adjusting a gain of an output voltage of the current-voltage conversion amplifier using a plurality of resistors; and a source follower circuit compensating for temperature for the output voltage of the current-voltage conversion amplifier.

In accordance with another aspect of the present invention, a method of compensating for temperature for an output voltage of a current-voltage conversion amplifier of an analog baseband filter for a multi-mode multi-band radio transceiver is provided. The method includes converting, by the current-voltage conversion amplifier, a current received at the analog baseband filter into a voltage and adjusting a gain of the output voltage of the current-voltage conversion amplifier using a plurality of resistors, and compensating, by the source follower circuit, for temperature for the output voltage of the current-voltage conversion amplifier.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skilled in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention proposes a method of replacing functions of a Current-to-Voltage (I-V) converter and a Power Gain Amplifier (PGA) with a resistor array to reduce a physical size and current consumption and a method of using a source follower circuit to solve a problem wherein Local Oscillator (LO) leakage occurs due to resistance varying according to a temperature.

Figure 1:
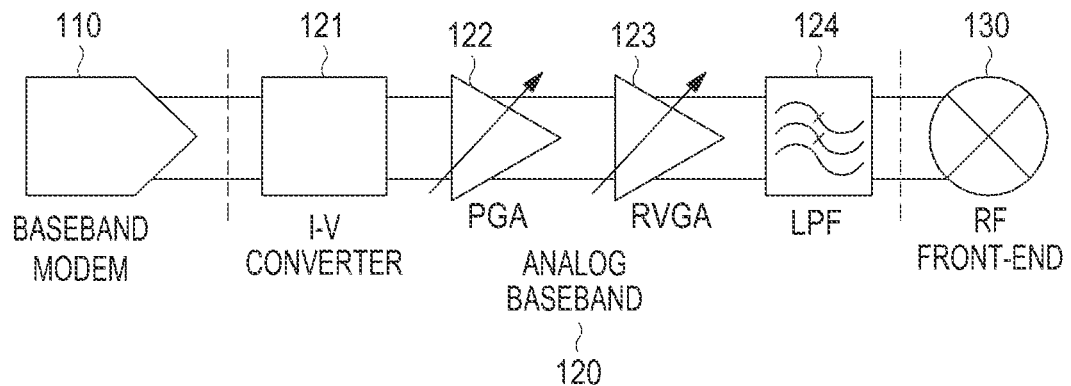
FIG. 1 illustrates the structure of a Transmission (TX) chain of a general Radio Frequency Integrated Circuit (RFIC) according to the related art.
Figure 2:
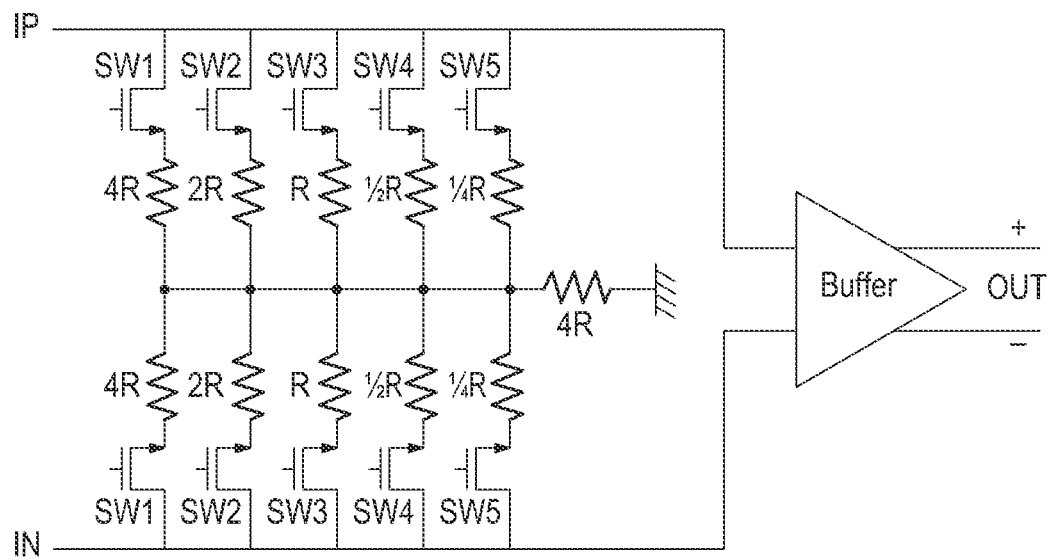
FIG. 2 illustrates a structure in which a Current-to-Voltage (I-V) converter is integrated with a Power Gain Amplifier (PGA) according to the related art.
Figure 3:
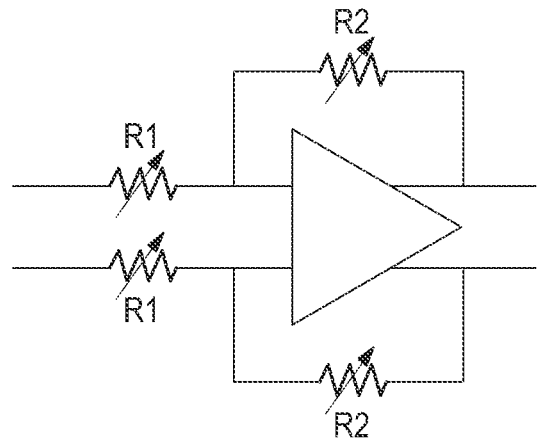
FIG. 3 illustrates a PGA structure according to the related art.
Figure 4:
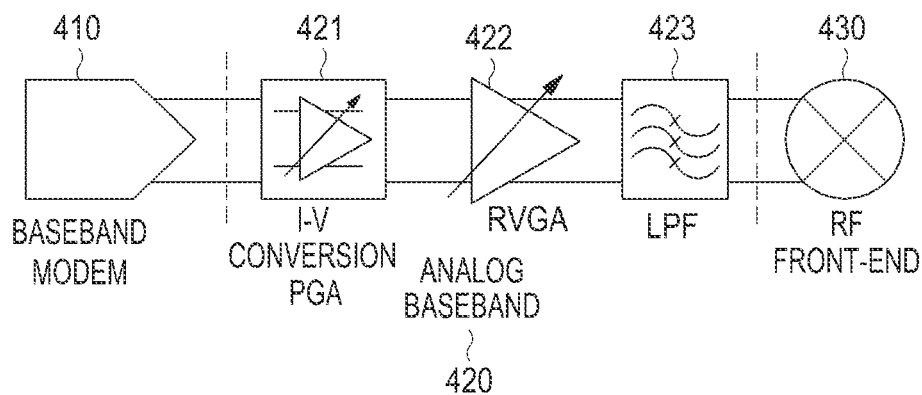
FIG. 4 illustrates the structure of a TX chain of an RFIC, in which functions of an I-V converter and a PGA are integrated into a single block according to an exemplary embodiment of the present invention.
Figure 5:
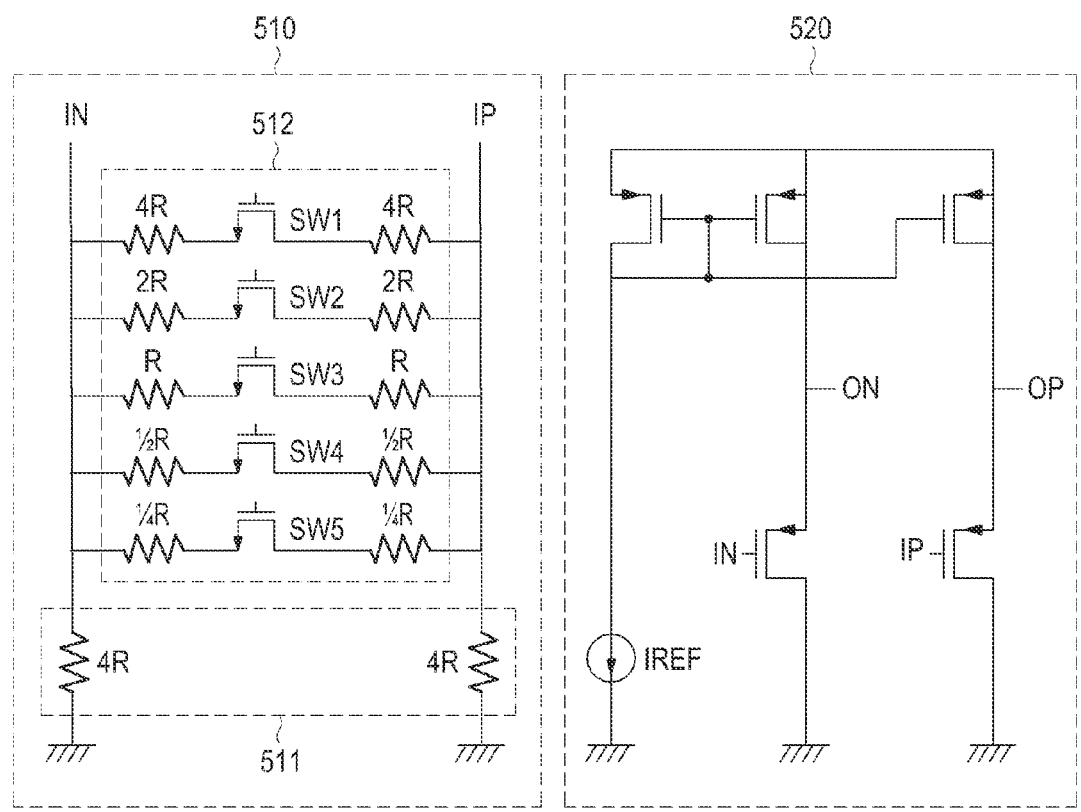
FIG. 5 illustrates a Resistor Programmable Gain Amplifier (RPGA) structure into which functions of an I-V converter and a PGA are integrated according to an exemplary embodiment of the present invention.

FIG. 4 illustrates a structure of a transmission (TX) chain of an Radio Frequency Integrated Circuit (RFIC), in which functions of an I-V converter and a PGA are integrated into a single block, according to an exemplary embodiment of the present invention, and FIG. 5 illustrates a structure into which functions of an I-V converter and a PGA are integrated, according to an exemplary embodiment of the present invention.

Referring to FIG. 4, the TX chain of the RFIC includes a baseband modem 410, an analog baseband 420, and a Radio Frequency (RF) front-end 430. The analog baseband modem 420 includes an I-V conversion PGA 421, a Ramping Variable Gain Amplifier (RVGA) 422, and a Low Pass Filter (LPF) 423.

Referring to FIG. 5, an I-V conversion PGA according to an exemplary embodiment of the present invention is comprised of a resistor array 510 and a source follower circuit 520 for compensating for temperature characteristics of resistors. The resistor array 510 includes a resistor part 511 for determining a common mode voltage and a resistor part 512 for determining signal swing. The resistor part 511 functions to determine a magnitude of a common mode voltage according to a direct current received from a baseband modem, and the resistor part 512 functions to determine a gain of the common mode voltage determined by the resistor part 511 according to on/off operations of switches SW1 through SW5. Although the resistor part 512 is assumed to be configured in five stages in FIG. 5, the present invention is not limited thereto, and the number of stages for adjusting a gain is subject to change according to the numbers of switches and resistors connected to the switches.

The source follower circuit 520 generates a reference current using a reference current source IREF, and then configures a current mirror circuit using a P-channel Metal Oxide Semiconductor (PMOS) with a temperature coefficient whose sign is opposite to that of a temperature coefficient of resistors constituting the resistor part 511 in order to replicate the reference current. The source follower circuit 520 maintains a common mode voltage constant by reducing an impact of resistance that varies according to a temperature. The source follower circuit 520 may be used separately from the resistor array 510. Although the source follower circuit 520 is assumed to be configured using a PMOS in FIG. 5, the source follower circuit 520 may be configured using an N-channel Metal Oxide Semiconductor (NMOS) having a temperature coefficient whose sign is the same as that of the temperature coefficient of the resistors.

FIGS. 6A to 6F illustrate different resistor connections of a resistor array according to on/off states of switches according to an exemplary embodiment of the present invention, and FIGS. 7A to 7F illustrate circuit diagrams in which half circuit analysis is applied to respective resistor connections of a resistor array according to on/off states of switches according to an exemplary embodiment of the present invention, as illustrated in FIGS. 6A through 6F.

Referring to FIGS. 6A to 6F and 7A to 7F, operation of the resistor array 510 will be described below FIGS. 6A to 6F illustrate different resistor connections of the resistor array 510 according to on/off states of the switches SW1 through SW5, and FIGS. 7A through 7F illustrate circuit diagrams in which half circuit analysis is applied to the respective resistor connections of the resistor array 510 according to the on/off states of the switches SW1 through SW5, as illustrated in FIGS. 6A through 6F.

Current that is output from a baseband modem has a DC component, such as a DC current IDC, and a signal component, such as a signal current Isig. The DC current IDC passes through the resistor part 511 so as to determine a common mode voltage level. If the resistors of the resistor part 511 are connected to the resistors of the resistor part 512 according to the on/off operations of the switches SW1 through SW5 included in the resistor part 512, then a signal swing is determined due to the influence of the signal current Isig.

Figure 6A:
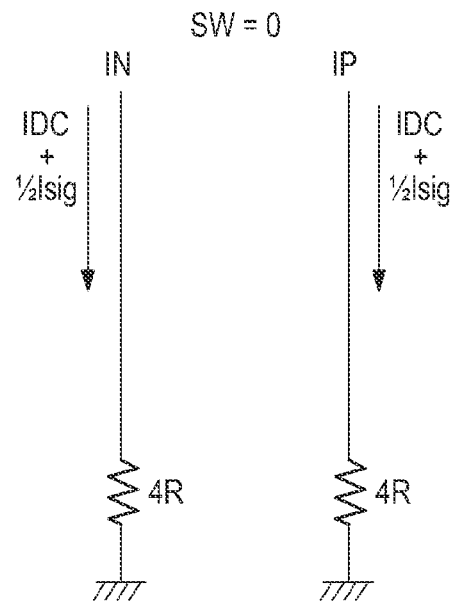
FIGS. 6A to 6F illustrate different resistor connections of a resistor array according to on/off states of switches according to an exemplary embodiment of the present invention.
Figure 7A:
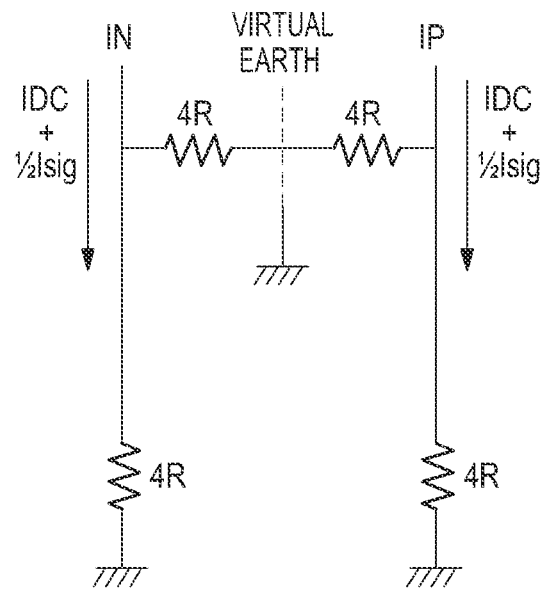
FIGS. 7A to 7F illustrate circuit diagrams in which half circuit analysis is applied to respective resistor connections of a resistor array according to on/off states of switches, as illustrated in FIGS. 6A through 6F, according to an exemplary embodiment of the present invention.

If all of the switches SW1 through SW5 are turned off, i.e., have a switch code=0) as illustrated in FIG. 6A, no current flows to the resistor part 512, and all the received current flows only to the resistor part 511. In this case, voltages Vin and Vip at Input Negative (IN) and Input Positive (IP) nodes are determined according to the DC current IDC, the signal current Isig received from the baseband modem, and a common mode resistance 4R. Additionally, as illustrated in FIG. 7A, effective resistance also becomes 4R, so that a signal swings on the basis of the voltages Vin and Vip. That is, values of In, Ip, Vin, and Vip are determined according to Equation (1) below.

$$In = Idc + \frac{1}{2}Isig, \quad Ip = Idc - \frac{1}{2}Isig \quad \text{Equation (1)}$$

$$Vin = 4R\left(Idc + \frac{1}{2}Isig\right) = 4R \cdot Idc + 2R \cdot Isig$$

$$Vip = 4R\left(Idc - \frac{1}{2}Isig\right) = 4R \cdot Idc - 2R \cdot Isig$$

Figure 6B:
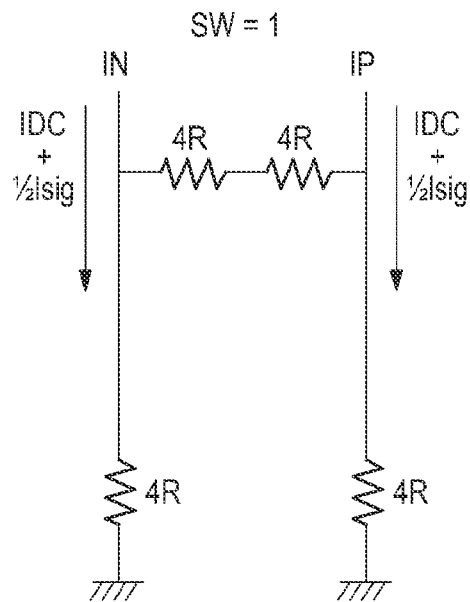
Figure 7B:
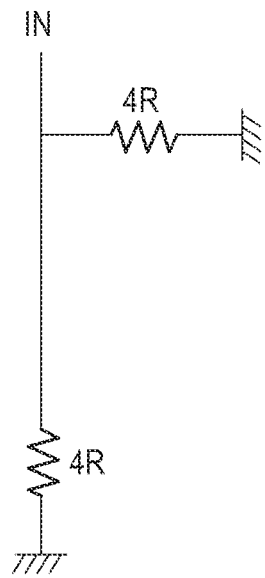

If the switch SW1 is turned on, i.e., a switch code=1, then the resistor part 511 and the resistor part 512 are connected as illustrated in FIG. 6B. In this case, the common voltages of the voltages Vin and Vip are maintained as IDC*Idc, as in the case of FIG. 6A. However, as illustrated in FIG. 7B, the resistor 4R of the resistor part 511 is connected in parallel to the resistor 4R of the resistor part 512, so that effective resistance for the signal current Isig is reduced to 2R. That is, the signal swing is halved, making it possible to obtain an attenuation effect of −6 dB.

Figure 6C:
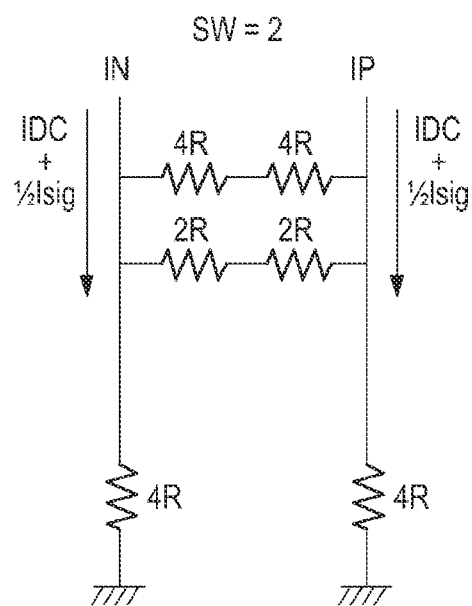
Figure 7C:
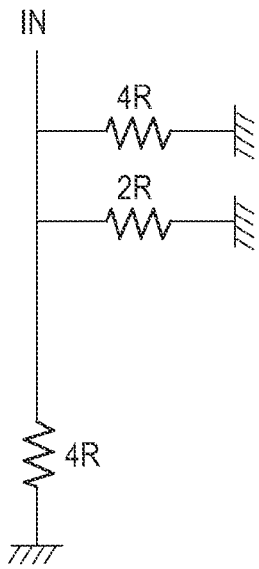

If the two switches SW1 and SW2 are turned on, i.e., a switch code=2, then the resistor part 511 is connected to the resistor part 512, as illustrated in FIG. 6C, and if the half circuit analysis is applied to the circuit of FIG. 6C, a circuit as illustrated in FIG. 7C illustrates the half circuit analysis of the circuit of FIG. 6C. In this case, the common voltages of the voltages Vin and Vip are maintained to be Idc*4R, similar to the cases illustrated in FIGS. 6A and 6B. However, the resistor 4R of the resistor part 511 is connected in parallel to the resistors 4R and 2R of the resistor part 512, so that an effective resistance for the signal current Isig is reduced to R. Accordingly, signal swing may obtain an attenuation effect of −12 dB.

Figure 6D:
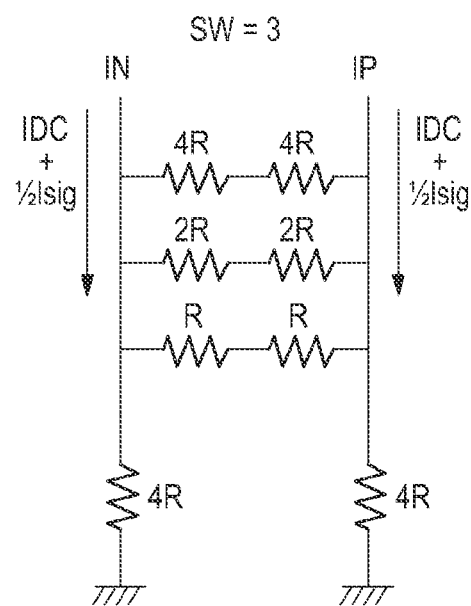
Figure 7D:
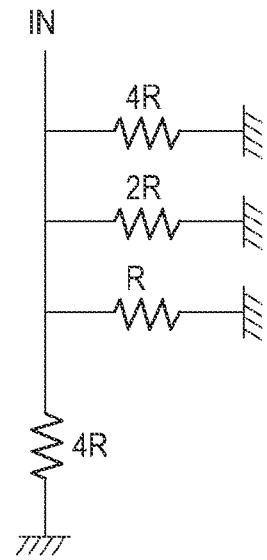

If the three switches SW1, SW2, and SW3 are turned on, i.e., a switch code=3, then the resistor part 511 is connected to the resistor part 512, as illustrated in FIG. 6D, and if the half circuit analysis is applied to the circuit of FIG. 6D, a circuit as illustrated in FIG. 7D illustrates the half circuit analysis of the circuit of FIG. 6D. In this case, the common voltages of the voltages Vin and Vip are maintained to be Idc*4R, similar to the cases illustrated in FIGS. 6A, 6B, and 6C. However, the resistor 4R of the resistor part 511 is connected in parallel to the resistors 4R, 2R, and R of the resistor part 512, so that an effective resistance for the signal current Isig is reduced to R/2. Accordingly, signal swing may obtain an attenuation effect of −18 dB.

Figure 6E:
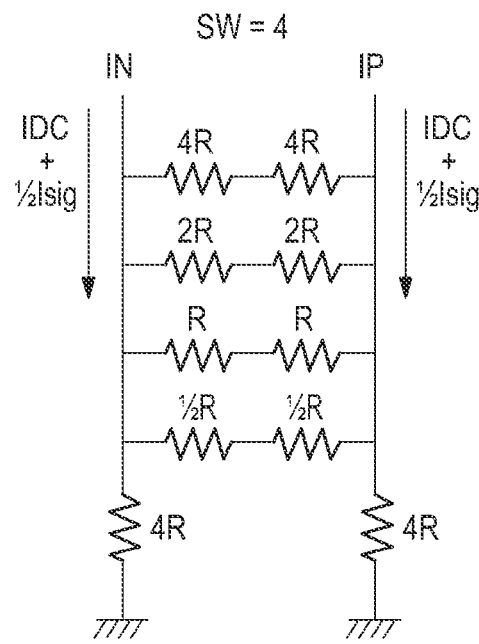
Figure 7E:
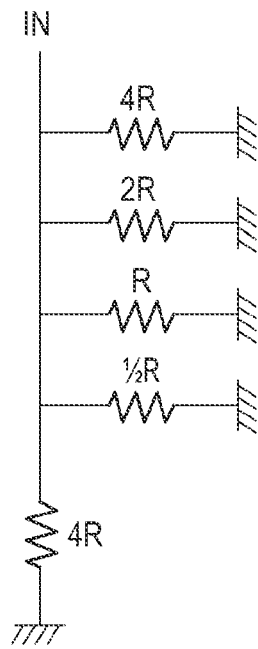

If the four switches SW1, SW2, SW3, and SW4 are turned on, i.e., a switch code=4, then the resistor part 511 is connected to the resistor part 512 as illustrated in FIG. 6E, and if the half circuit analysis is applied to the circuit of FIG. 6E, a circuit as illustrated in FIG. 7E illustrates the half circuit analysis of the circuit of FIG. 6E. In this case, the common voltages of the voltages Vin and Vip are maintained to be Idc*4R, similar to the cases illustrated in FIGS. 6A to 6D. However, the resistor 4R of the resistor part 511 is connected in parallel to the resistors 4R, 2R, R, and R/2 of the resistor part 512, so that an effective resistance for the signal current Isig is reduced to R/4. Accordingly, signal swing may obtain an attenuation effect of −24 dB.

Figure 6F:
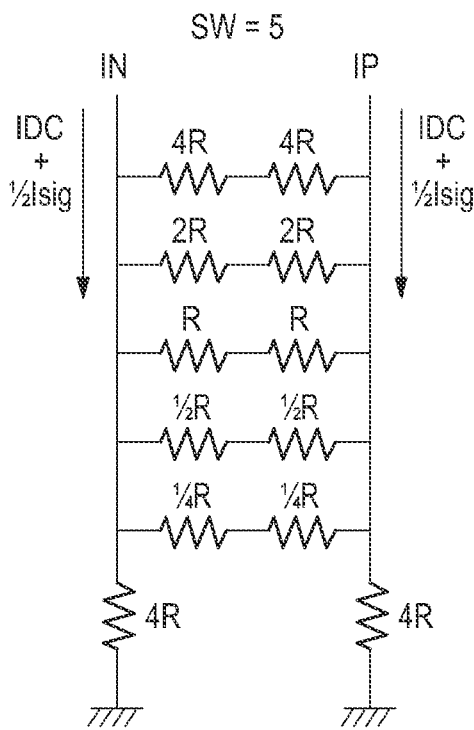
Figure 7F:
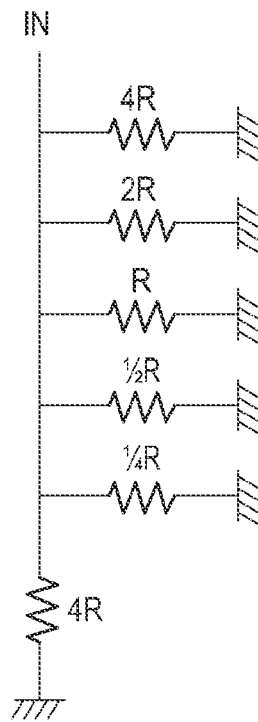

Likewise, if all of the five switches SW1, SW2, SW3, SW4, and SW5 are turned on, i.e., a switch code=5, then the resistor part 511 is connected to the resistor part 512 as illustrated in FIG. 6F, and if the half circuit analysis is applied to the circuit of FIG. 6F, a circuit as illustrated in FIG. 7F illustrates the half circuit analysis of the circuit of FIG. 6F. In this case, the common voltages of the voltages Vin and Vip are maintained to be Idc*4R, similar to the cases illustrated in FIGS. 6A through 6E. However, the resistor 4R of the resistor part 511 is connected in parallel to the resistors 4R, 2R, R, R/2, and R/4 of the resistor part 512, so that an effective resistance for the signal current Isig is reduced to R/8. Accordingly, signal swing may obtain an attenuation effect of −30 dB.

As such, as a switch code increases according to the present exemplary embodiments, switch connections are increased so that more resistors are connected in parallel. However, the present invention is not limited thereto and the variances in the switch code may correspond to a number of resistors that are connected in parallel according to any suitable manner. Accordingly, a signal gain decreases by −6 dB whenever a switch code increases by 1. That is, in the case in which five switches are used, as illustrated in FIG. 5, a gain/dynamic range of 0 dB to −30 dB may be ensured according to the on/off states of the switches.

Next, the operation of the source follower circuit 520, as illustrated in FIG. 5, will be described. The resistance of a resistor may vary according to a temperature. That is, as a temperature rises, the resistance of a resistor may increase. If a temperature changes, a common mode voltage that is determined by a common mode resistor and DC current may change, and if a temperature changes after DC offset calibration, LO leakage may occur. The LO leakage is compensated for by the source follower circuit 520. The operation of the source follower circuit 520 can be understood through a current square law that is expressed as Equation (2) below.

$$Ibias = \frac{1}{2} \cdot u_p \cdot C_{ox} \frac{W}{L}(V_{sg} - |V_{th}|)^2 \quad \text{Equation (2)}$$

$$V_{sg} = V_{on} - V_{in}$$

$$\Rightarrow V_{on} = V_{in} + |V_{th}| + \sqrt{\frac{2 \cdot I_{bias}}{u_p \cdot C_{ox} \frac{W}{L}}}$$

In Equation (2), Ibias represents a bias current of the PMOS, μp represents hole mobility, Cox represents the conductance of the PMOS, W represents the width of a hole, L represents a length by which electrons have to move, Vsg represents a voltage between a source and a gate, and Vth represents a threshold voltage.

According to Equation (2), the threshold voltage Vth and the hole mobility μp, from among variables that determine an output voltage Von, are values that may vary according to a temperature. The threshold value Vth, from among the two variables Vth and μp, may change, and may change between −1 mV/degree and 2 mV/degree according to a process.

According to an exemplary embodiment, by adjusting the width W, the length L, and the bias current Ibias of a device used in the source follower circuit 520, an appropriate compensation point may be determined according to a circuit. That is, by appropriately adjusting the three variables of W, L, and Ibias according to the common mode voltage of the source follower circuit 520, a point at which a change according to a temperature is smallest may be determined.

Figure 8:
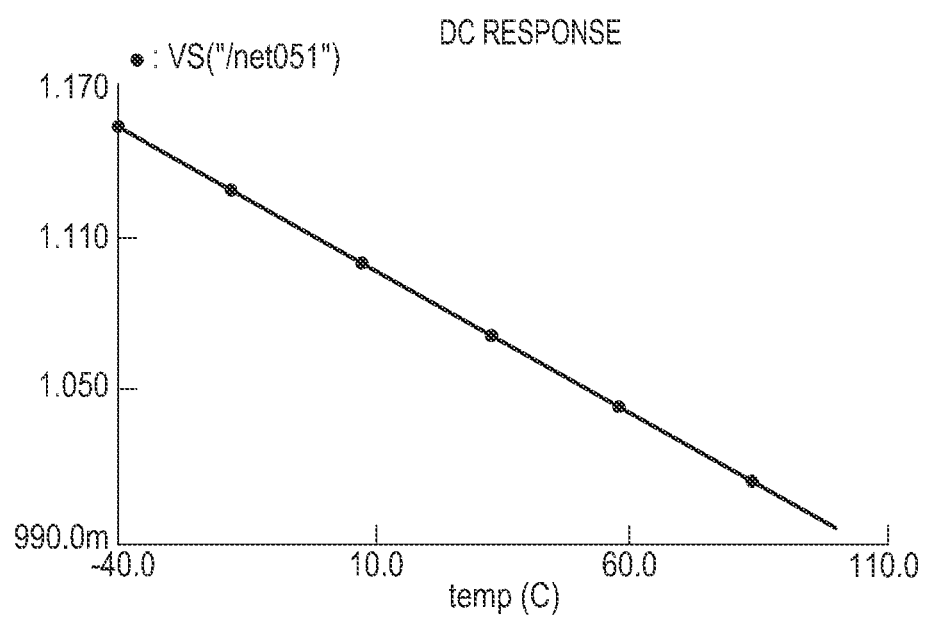
FIG. 8 is a graph illustrating temperature compensation effects of a P-channel Metal Oxide Semiconductor (PMOS) source follower circuit according to an exemplary embodiment of the present invention.

FIG. 8 is a graph illustrating the results of temperature compensation effects of a PMOS source follower circuit according to an exemplary embodiment of the present invention.

Referring to FIG. 8, a DC voltage that is determined by DC current is reduced when a temperature rises because a threshold voltage Vth decreases according to the increase in temperature.

Figure 9:
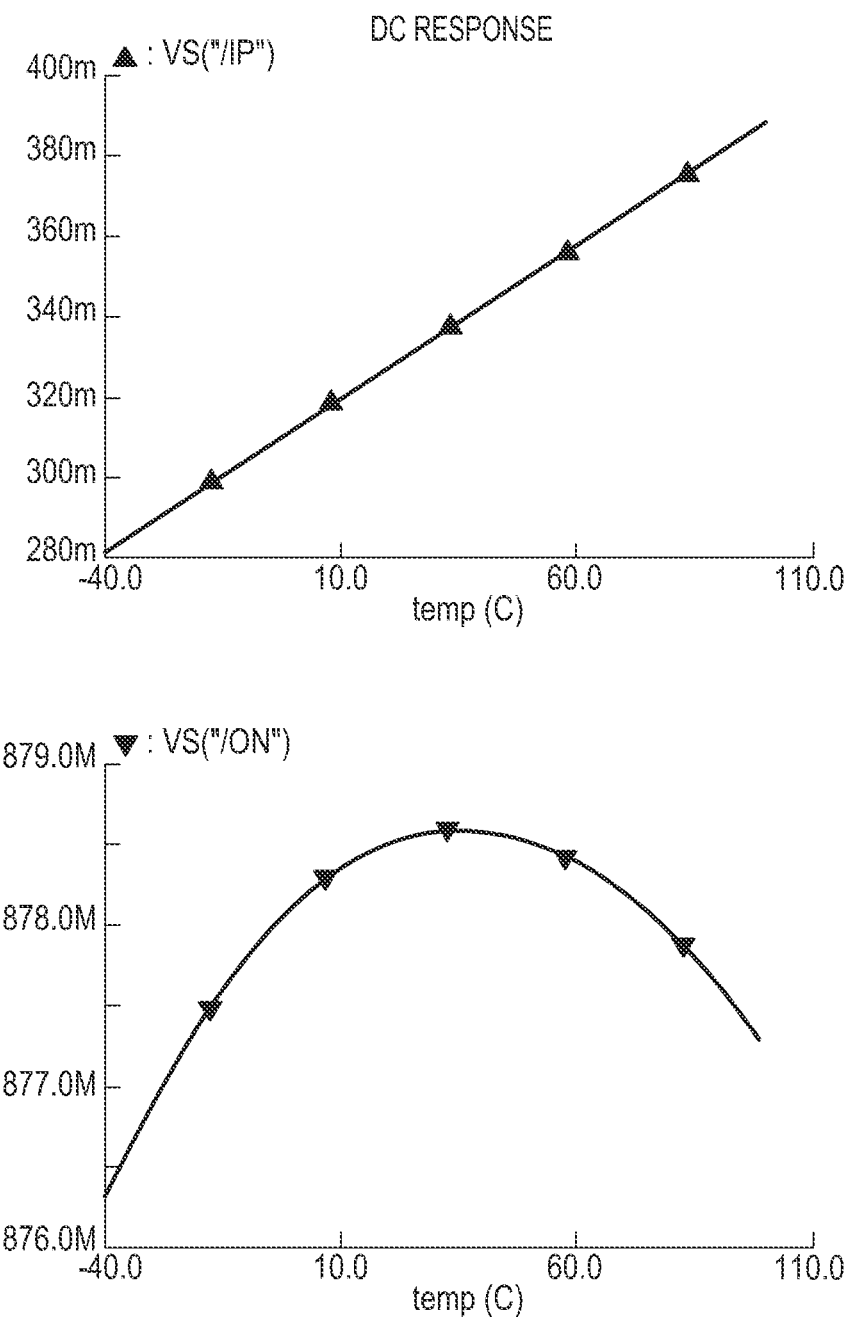
FIG. 9 is graphs illustrating an input voltage and an output voltage of a source follower circuit according to an exemplary embodiment of the present invention.

FIG. 9 is graphs illustrating an input voltage and an output voltage of a source follower circuit according to an exemplary embodiment of the present invention.

Referring to FIG. 9, a voltage that is determined by a common mode voltage and DC current changes up to approximately 100 mV according to a change in temperature, as shown in the upper graph of FIG. 9. However, if the source follower circuit is applied, the amount of a change in voltage according to a change in temperature may be limited to about 3 mV or less, as shown in the lower graph of FIG. 9.

According to the present exemplary embodiments, by integrating an I-V converter and a PGA block, from among components of an analog baseband in the TX chain of an RFIC, a common mode voltage constant may be maintained despite a change in temperature while reducing current consumption and a physical size of the RFIC, thereby preventing the occurrence of LO leakage.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An analog baseband filter of a multi-mode multi-band radio transceiver, the analog baseband filter comprising:
   a current-voltage conversion amplifier having a resistor array including at least one resistor; and
   a source follower circuit having a current mirror circuit configured to generate a reference current according to a first temperature coefficient corresponding to the resistor array.

2. The analog baseband filter of claim 1,
   wherein the current-voltage conversion amplifier is connected to a baseband modem of the multi-mode multi-band radio transceiver, and
   wherein the source follower circuit is further configured to provide the generated reference current to a low pass filter of the multi-mode multi-band radio transceiver.

3. The analog baseband filter of claim 1,
   wherein the current-voltage conversion amplifier is configured to convert a current received at the analog baseband filter into a voltage, and
   wherein the current-voltage conversion amplifier is further configured to adjust a gain of an output voltage of the current-voltage conversion amplifier according to the resistor array.

4. The analog baseband filter of claim 1, wherein the source follower circuit comprises a P-channel Metal Oxide Semiconductor (PMOS) having the first temperature coefficient whose sign is opposite to that of a second temperature coefficient of the resistor array.

5. The analog baseband filter of claim 1, wherein the source follower circuit comprises an N-channel Metal Oxide Semiconductor (NMOS) having the first temperature coefficient whose sign is the same as that of a second temperature coefficient of the resistors.

6. The analog baseband filter of claim 1, wherein the current mirror circuit is comprised of at least one P-channel Metal Oxide Semiconductor (PMOS) and at least one N-channel Metal Oxide Semiconductor (NMOS).

7. The analog baseband filter of claim 1, wherein the current-voltage conversion amplifier comprises:
   a first resistor part generating a common mode voltage using a first resistor and a second resistor respectively connected between two input terminals and a ground, the two input terminals receiving input current as a differential input; and
   a second resistor part including at least two resistors and at least one switch connected between the at least two resistors, the second resistor part adjusting the gain of the output voltage according to operations of the at least one switch.

8. The analog baseband filter of claim 7, wherein the second resistor part comprises:
   at least one third resistor respectively connected in parallel to the first resistor at an end of the differential input; and
   at least one fourth resistor respectively connected in parallel to the second resistor at another end of the differential input,
   wherein each of the at least one switch is respectively connected in series between the at least one third resistor and the at least one fourth resistor.

9. The analog baseband filter of claim 7, wherein the first resistor and the second resistor of the first resistor part are connected in parallel to the at least two resistors of the second resistor part according to operations of the switches in order to adjust the gain of the output voltage.

10. An analog baseband filter of a multi-mode multi-band radio transceiver, the analog baseband filter comprising:
    a current-voltage conversion amplifier having a resistor array including at least one resistor; and
    a source follower circuit having a current mirror circuit configured to generate a reference current according to a first temperature coefficient corresponding to the resistor array,
    wherein the current-voltage conversion amplifier comprises:
       a first resistor part generating a common mode voltage using a first resistor and a second resistor respectively connected between two input terminals and a ground, the two input terminals receiving input current as a differential input; and
       a second resistor part including at least two resistors and at least one switch connected between the at least two resistors, the second resistor part adjusting the gain of the output voltage according to operations of the at least one switch.

11. The analog baseband filter of claim 10,
    wherein the current-voltage conversion amplifier is connected to a baseband modem of the multi-mode multi-band radio transceiver, and
    wherein the source follower circuit is further configured to provide the generated reference current to a low pass filter of the multi-mode multi-band radio transceiver.

12. The analog baseband filter of claim 10,
wherein the current-voltage conversion amplifier is configured to convert a current received at the analog baseband filter into a voltage, and
wherein the current-voltage conversion amplifier is further configured to adjust a gain of an output voltage of the current-voltage conversion amplifier according to the resistor array.

13. The analog baseband filter of claim 10, wherein the source follower circuit comprises a P-channel Metal Oxide Semiconductor (PMOS) having the first temperature coefficient whose sign is opposite to that of a second temperature coefficient of the resistor array.

14. The analog baseband filter of claim 10, wherein the source follower circuit comprises an N-channel Metal Oxide Semiconductor (NMOS) having the first temperature coefficient whose sign is the same as that of a second temperature coefficient of the resistors.

15. The analog baseband filter of claim 10, wherein the current mirror circuit is comprised of at least one P-channel Metal Oxide Semiconductor (PMOS) and at least one N-channel Metal Oxide Semiconductor (NMOS).

16. The analog baseband filter of claim 10, wherein the second resistor part comprises:
at least one third resistor respectively connected in parallel to the first resistor at an end of the differential input; and
at least one fourth resistor respectively connected in parallel to the second resistor at another end of the differential input,
wherein each of the at least one switch is respectively connected in series between the at least one third resistor and the at least one fourth resistor.

17. The analog baseband filter of claim 10, wherein the first resistor and the second resistor of the first resistor part are connected in parallel to the at least two resistors of the second resistor part according to operations of the switches in order to adjust the gain of the output voltage.

* * * * *